United States Patent
Lee et al.

(10) Patent No.: US 8,211,749 B2
(45) Date of Patent: Jul. 3, 2012

(54) INTEGRATED CIRCUIT PACKAGE SYSTEM WITH WAFERSCALE SPACER

(75) Inventors: Sang-Ho Lee, Kyounggi (KR); Jong-Woo Ha, Seoul (KR); Soo-San Park, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 740 days.

(21) Appl. No.: 11/465,706

(22) Filed: Aug. 18, 2006

(65) Prior Publication Data
US 2008/0042245 A1    Feb. 21, 2008

(51) Int. Cl.
*H01L 21/50* (2006.01)
(52) U.S. Cl. .................. 438/113; 257/E21.596
(58) Field of Classification Search .................. 438/110, 438/113, 458, 68, 460, 462, 107–109; 257/E21.596, 257/E21.599
See application file for complete search history.

(56) References Cited

U.S. PATENT DOCUMENTS

| | | | |
|---|---|---|---|
| 5,323,060 | A | 6/1994 | Fogal et al. |
| 6,472,758 | B1 | 10/2002 | Glenn et al. |
| 6,569,709 | B2 | 5/2003 | Derderian |
| 6,812,049 | B1 | 11/2004 | Tracy |
| 6,916,686 | B2 | 7/2005 | Wada et al. |
| 6,933,172 | B2 * | 8/2005 | Tomimatsu .............. 438/109 |
| 6,977,439 | B2 | 12/2005 | Kang et al. |
| 7,129,110 | B1 * | 10/2006 | Shibata ................. 438/106 |
| 7,208,346 | B2 * | 4/2007 | Lee ....................... 438/110 |
| 2005/0224959 | A1 | 10/2005 | Kwon et al. |
| 2005/0277228 | A1 | 12/2005 | Lee |
| 2008/0012095 | A1 * | 1/2008 | Lee et al. ............... 257/618 |

* cited by examiner

*Primary Examiner* — Hoa B Trinh
(74) *Attorney, Agent, or Firm* — Ishimaru & Associates LLP; Mikio Ishimaru; Stanley Chang

(57) ABSTRACT

An integrated circuit packaging system is provided including forming a first device wafer having a first backside and a first active side; forming a waferscale spacer wafer having a waferscale spacer and a first opening; mounting the waferscale spacer wafer on the first backside; and singulating an first integrated circuit die having the waferscale spacer from the first device wafer having the first backside with the waferscale spacer wafer thereon.

10 Claims, 4 Drawing Sheets

INTEGRATED CIRCUIT PACKAGE SYSTEM WITH WAFERSCALE SPACER

CROSS-REFERENCE TO RELATED APPLICATION

The present application contains subject matter related to U.S. patent application Ser. No. 11/456,845, filed Jul. 11, 2006, now U.S. Pat. No. 8,039,365.

TECHNICAL FIELD

The present invention relates generally to integrated circuit manufacturing, and more particularly to a system for using a spacer for same die stacking.

BACKGROUND ART

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for lower height, smaller space, and cost reduction.

One proven way to reduce cost is to use mature package technologies with existing manufacturing methods and equipments, or in some cases eliminate some of the existing steps and equipments. Paradoxically, the reuse of existing manufacturing processes does not typically result in the reduction of package dimensions. Still the demand continues for lower cost, smaller size, and more functionality.

Stacking more integrated circuits into a package is one way to squeeze more integrated circuit content into smaller real estate. Thinning the wafers and integrated circuits provide lower height integrated circuit stacks and packages. As the thinning process evolves to more aggressive "thinness" of the wafers and the integrated circuits, the thinned integrated circuits are more prone to damage throughout the silicon manufacturing and packaging processes.

Existing stacked packages, in case of same size integrated circuit die application, requires separate spacer attachment between upper and lower integrated circuit die to lift up the upper integrated circuit die for enabling wire bonding and preventing wires from touching the edge of the lower integrated circuit die. Typically, a spacer is silicon die or film and prepared by additional semiconductor assembly processes. The silicon spacer manufacturing and packaging processes requires the spacer wafer thinning, the spacer wafer mount and sawing, and the spacer attach and cure. The film spacer calls for the cut and place process.

The silicon spacer handling throughout the manufacture and package assembly processes constrains the spacer patterns and size. Similarly, film or paste spacers also constrain the spacer patterns and size. Both processes do not keep pace with the shrinking geometries of integrated circuits without changes/capital investments to the manufacture processes and equipments, do not optimally support the continued reduction of the integrated circuit thickness, and do not optimally provide lower package height.

Thus, a need still remains for an integrated circuit packaging system low cost manufacturing as well as reduce the integrated circuit package height. In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit packaging system including forming a first device wafer having a first backside and a first active side; forming a waferscale spacer wafer having a waferscale spacer and a first opening; mounting the waferscale spacer wafer on the first backside; and singulating a first integrated circuit die having the waferscale spacer from the first device wafer having the first backside with the waferscale spacer wafer thereon. Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
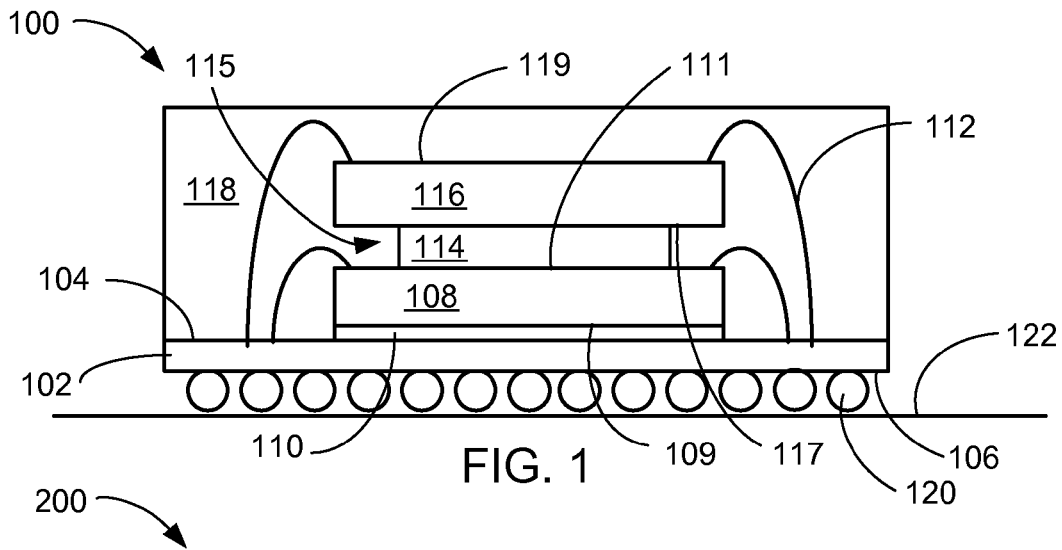
FIG. 1 is a cross-sectional view of an integrated circuit packaging system with waferscale spacer, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the substrate surface, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure. The term "waferscale" as used herein includes structures the size of a wafer, such as a silicon wafer, in which and upon which integrated circuits and micro electronic machines are formed. Waferscale structures are characterized by having sharp geometric shapes for submicron-sized structures. The characteristics of singulation may include physical features, such as micro-abrasions, which are indicative of a lasing or mechanical dicing process.

Referring now to FIG. 1, therein is shown a cross-sectional view of an integrated circuit package system 100 with waferscale spacer, in an embodiment of the present invention. The cross-sectional view of the integrated circuit package system 100 depicts a substrate 102 having a top surface 104 and a bottom surface 106. A first integrated circuit device 108, such as an integrated circuit die or an integrated circuit wafer, has a first backside 109 and a first active side 111. The first backside 109 is mounted on the substrate 102 with an adhesive material 110, such as die attach material. Electrical interconnects 112, such as bond wires, couple the first integrated circuit device 108 to the top surface 104. The first integrated circuit device 108 has a waferscale spacer 114 mounted on the first active side 111. The waferscale spacer 114 has recesses 115 that allow a clearance around the electrical interconnects 112.

A second integrated circuit device 116, such as an integrated circuit die or an integrated circuit wafer, is mounted on the waferscale spacer 114. A contact contamination problem is avoided by placing the waferscale spacer 114 on a second backside 117 of the second integrated circuit device 116. The recesses 115 of the waferscale spacer 114 provides sufficient spacing that the second backside 117 of the second integrated circuit device 116 does not contact the electrical interconnects 112 that couple the first integrated circuit device 108 to the substrate 102. An additional group of the electrical interconnects 112 couple a second active side 119 to the top surface 104 of the substrate 102. The waferscale spacer 114 sufficiently elevates to the second integrated circuit device 116 to prevent wire sweep conflicts between the electrical interconnects 112 of the first integrated circuit device 108 and the second integrated circuit device 116. For illustrative purposes, the first integrated circuit device 108 and the second integrated circuit device 116 are shown as substantially the same size, although it is understood that the first integrated circuit device 108 and the second integrated circuit device 116 may not be the same size.

As an alternative construction, the waferscale spacer 114 may be initially attached to the first active side 111 of the first integrated circuit device 108. In this construction, the waferscale spacer 114 is positioned on the first integrated circuit device 108 before the electrical interconnects 112 have coupled the first integrated circuit device 108 to the top surface 104 of the substrate 102.

A package cover 118, such as an epoxy molding compound, encapsulates the top surface 104, the first integrated circuit device 108, the waferscale spacer 114, the second integrated circuit device 116 and the electrical interconnects 112. System interconnects 120, such as solder balls, stud bumps, or solder columns, are mounted on the bottom surface 106 of the substrate 102.

The integrated circuit package system 100 may be part of an electronic system 122, such as handheld electronic device or an enterprise class system. The integrated circuit package system 100 may be a wafer level chip scale package (WLCSP) having the first integrated circuit device 108 as a first integrated circuit wafer and the second integrated circuit device 116 as a second integrated circuit wafer. The integrated circuit package system 100 may be a multi-chip integrated circuit package having the first integrated circuit device 108 as a first integrated circuit die and the second integrated circuit device 116 as a second integrated circuit die.

Figure 2:
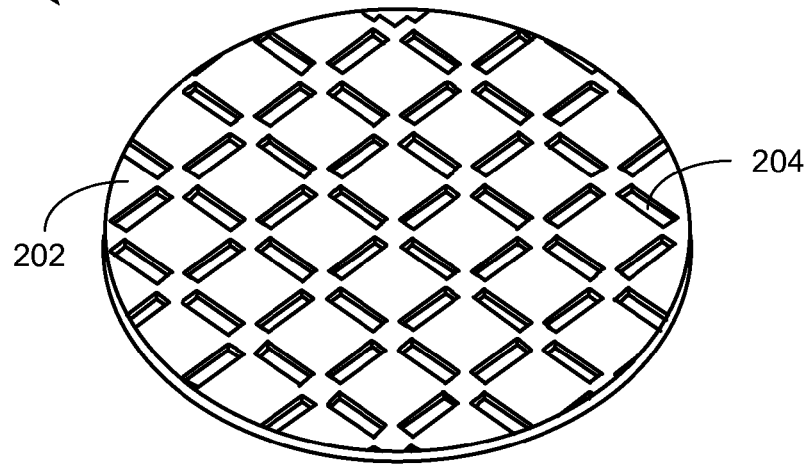
FIG. 2 is a top perspective view of a waferscale spacer wafer, in an embodiment of the present invention.

Referring now to FIG. 2, therein is shown a top perspective view of a waferscale spacer wafer 200, in an embodiment of the present invention. The top perspective view of the waferscale spacer wafer 200 depicts waferscale spacers 202 and rectangular openings 204 arranged in a predetermined pattern across the waferscale spacer wafer 200. The rectangular openings 204 are between the waferscale spacers 202. The pattern is aligned with the contact pads (not shown) of a semiconductor wafer (not shown) on which it will be mounted. The waferscale spacers 202 may be composed of an inorganic or an organic material. The organic material may be used as an electrical insulator.

The waferscale spacers 202 may represent the waferscale spacer 114 of FIG. 1. For illustrative purposes, the waferscale spacer wafer 200 is shown having the waferscale spacers 202 of substantially the same form, although it is understood that the waferscale spacer wafer 200 may have the waferscale spacers 202 of different forms. For example, the waferscale spacer wafer 200 may have different structures of the waferscale spacers 202 including structures of different geometric shapes, different openings, different channels, different elevations, or a combination thereof.

Figure 3:
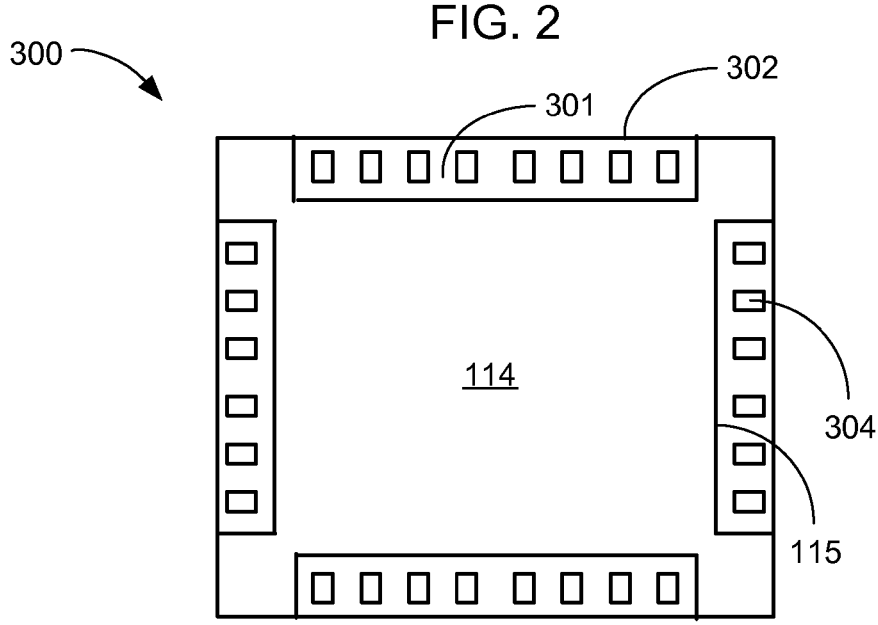
FIG. 3 is a top view of a singulated die down with the waferscale spacer mounted on an active side.

Referring now to FIG. 3, therein is shown a top view of a singulated die down 300 with the waferscale spacer 114 mounted on an active side 301. The top view of the singulated die down 300 depicts an integrated circuit die 302 with contact pads 304 arranged around the perimeter. The waferscale spacer 114 is positioned so that the recesses 115 leaves access to the contact pads 304 for later attachment. The substantially exact fit of the waferscale spacer 114 to the integrated circuit die 302 is a benefit of the mounting before singulation process. The waferscale spacer 114 manufactured as a wafer utilizing similar or substantially the same manufacturing processes as those used to manufacture the integrated circuit die 302.

Figure 4:
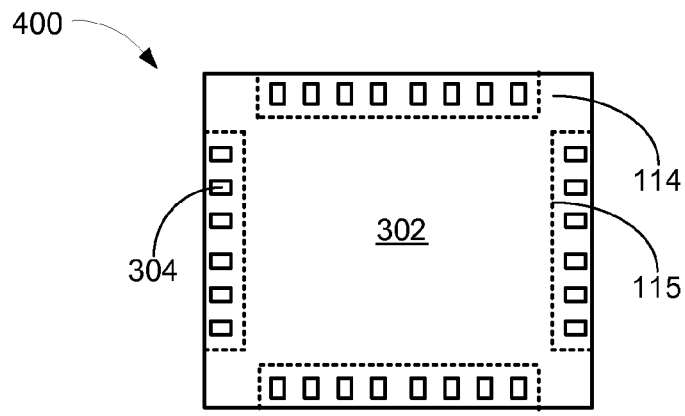
FIG. 4 is a plan view of a singulated die up with the waferscale spacer mounted on a backside.

Referring now to FIG. 4, therein is shown a plan view of a singulated die up 400 with the waferscale spacer 114 mounted on a backside. The plan view of the singulated die up 400 depicts the integrated circuit die 302 with the contact pads 304 arranged around the perimeter. The waferscale spacer 114 is positioned on the backside of the integrated circuit die 302 so that the recesses 115 leaves access along the contact pads 304 of the another integrated circuit die (not shown) on which it will be attached. The substantially exact fit of the waferscale spacer 114 to the integrated circuit die 302 is a benefit of the mounting the waferscale spacer wafer 200 on the semiconductor wafer before the singulation process. The waferscale spacer 114, mounted adjacent to the integrated circuit die 302, has an exact fit with the integrated circuit die 302 at all four corners between the recesses 115 as a result of the concurrent singulation. The waferscale spacer 114 manufactured as a wafer utilizing similar or substantially the same manufacturing process and equipments as those used to manufacture the integrated circuit die 302.

Figure 5:
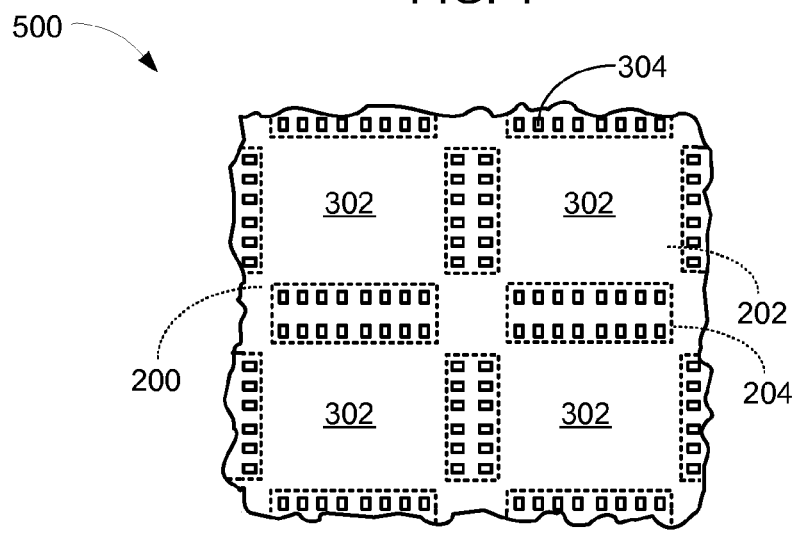
FIG. 5 is a plan view of a portion of a wafer, prior to singulation, having the waferscale spacer wafer backside mounted with the rectangular openings for the contact pads, in an embodiment of the present invention.

Referring now to FIG. 5, therein is shown a plan view of a portion of a device wafer 500, prior to singulation, having the waferscale spacer wafer 200 backside mounted with the rectangular openings 204 for the contact pads 304, in an embodiment of the present invention. The plan view of the portion of the device wafer 500 depicts the contact pads 304 aligned around the perimeter of the integrated circuit die 302, prior to singulation. The waferscale spacer wafer 200 is backside mounted to the device wafer 500 with the rectangular openings 204 substantially aligned beneath the contact pads 304.

Figure 6:
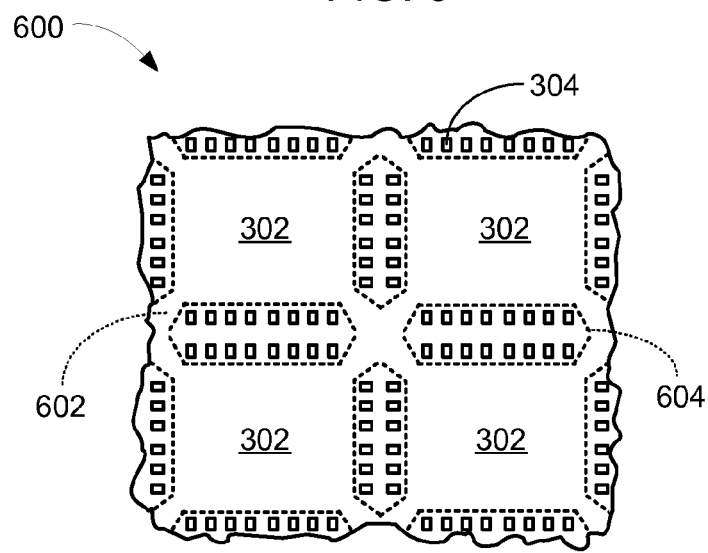
FIG. 6 is a plan view of the portion of the wafer, prior to singulation, having the waferscale spacer wafer backside mounted with hexagonal openings for the contact pads, in an alternative embodiment of the present invention.

Referring now to FIG. 6, therein is shown a plan view of a portion of a device wafer 600, prior to singulation, having a waferscale spacer wafer 602 backside mounted with hexagonal openings 604 for the contact pads 304, in an alternative embodiment of the present invention. The plan view of the portion of the device wafer 600 depicts the contact pads 304 substantially aligned with the perimeter of the integrated circuit die 302, prior to singulation. The waferscale spacer wafer 602 is backside mounted to the device wafer 600 with the hexagonal openings 604 substantially aligned beneath the contact pads 304. This configuration may provide more clearance around the end of the rows of the contact pads 304. The additional clearance may allow a wider angle for attachment of the electrical interconnects 112, of FIG. 1.

Figure 7:
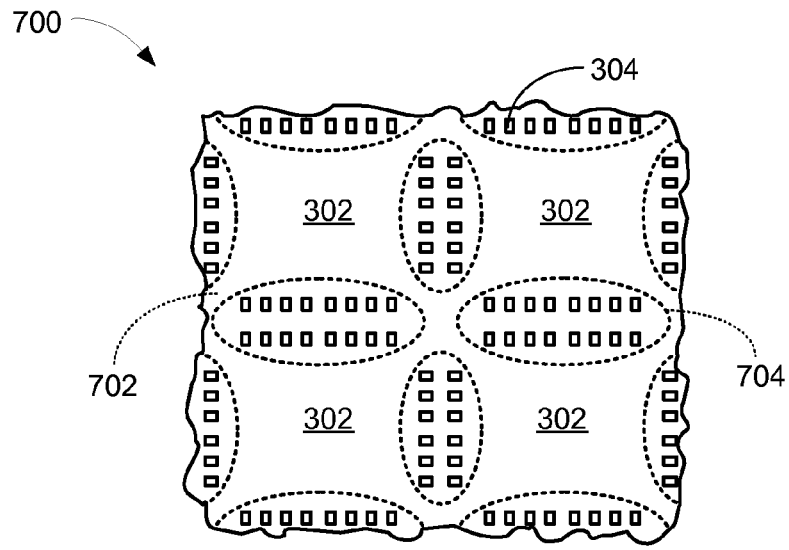
FIG. 7 is a plan view of the portion of the wafer, prior to singulation, having the waferscale spacer wafer, with elliptical openings for the contact pads, backside mounted, in another alternative embodiment of the present invention.

Referring now to FIG. 7, therein is shown a plan view of a portion of a device wafer 700, prior to singulation, having a waferscale spacer wafer 702 with elliptical openings 704 for the contact pads 304 backside mounted, in another alternative embodiment of the present invention. The plan view of the portion of the device wafer 700 depicts the contact pads 304 substantially aligned around the perimeter of the integrated circuit die 302, prior to singulation. The waferscale spacer wafer 702 is backside mounted to the device wafer 700 with the elliptical openings 704 substantially aligned beneath the contact pads 304. This configuration may provide more clearance around the end of the rows of the contact pads 304. The additional clearance may allow a wider angle for attachment of the electrical interconnects 112, of FIG. 1.

Figure 8:
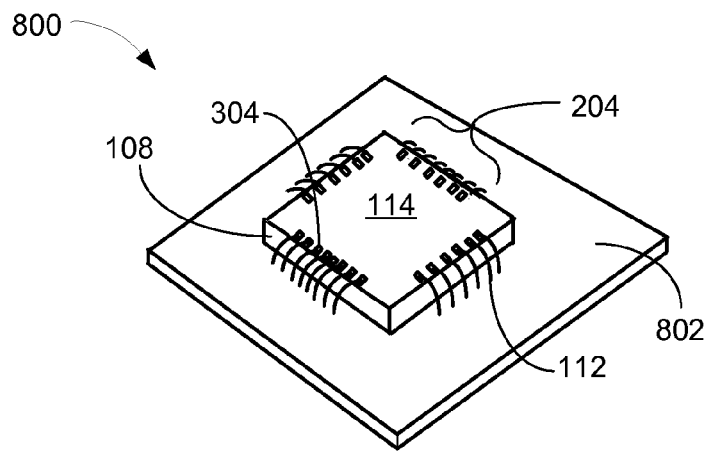
FIG. 8 is a top perspective view of an integrated circuit package, in a first integrated circuit die attach phase.

Referring now to FIG. 8, therein is shown a top perspective view of an integrated circuit package 800, in the first integrated circuit device 108 attach phase. The top perspective view of the integrated circuit package 800 depicts the first integrated circuit device 108 mounted on a substrate 802 and coupled to the substrate 802 by the electrical interconnects 112. The waferscale spacer 114 of FIG. 1 is manufactured to be substantially aligned with the first integrated circuit device 108 with the recesses 115 around the contact pads 304.

Figure 9:
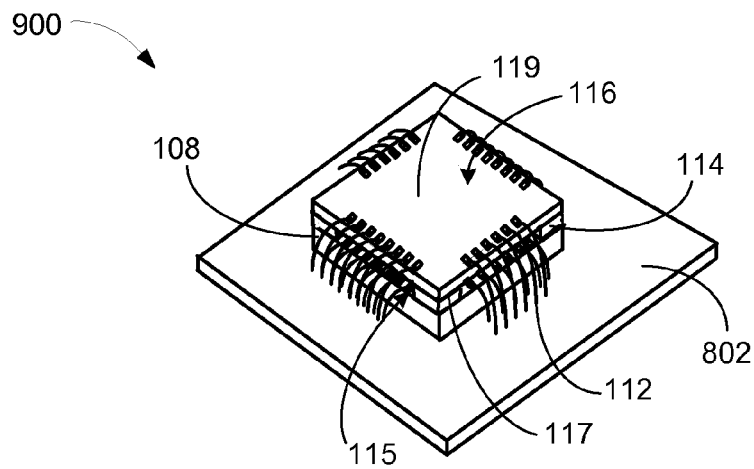
FIG. 9 is a top perspective view of an integrated circuit package, in a second integrated circuit die attach phase.

Referring now to FIG. 9, therein is shown a top perspective view of an integrated circuit package 900, in the second integrated circuit device 116 attach phase. The second integrated circuit device 116 has the waferscale spacer 114 on the second backside 117. The top perspective view of the integrated circuit package 900 depicts the substrate 802 having the first integrated circuit device 108 mounted thereon. The waferscale spacer 114 is between the first integrated circuit device 108 and the second integrated circuit device 116. The waferscale spacer 114 provides a vertical clearance between the first integrated circuit device 108 and the second integrated circuit device 116 so that the electrical interconnects 112 on the first integrated circuit device 108 do not contact the second backside 117 of the second integrated circuit device 116. The electrical interconnects 112 connect to the first integrated circuit device 108 in the recesses 115. The electrical interconnects 112 also connect the second active side 119 of the second integrated circuit device 116 and the substrate 802.

Figure 10:
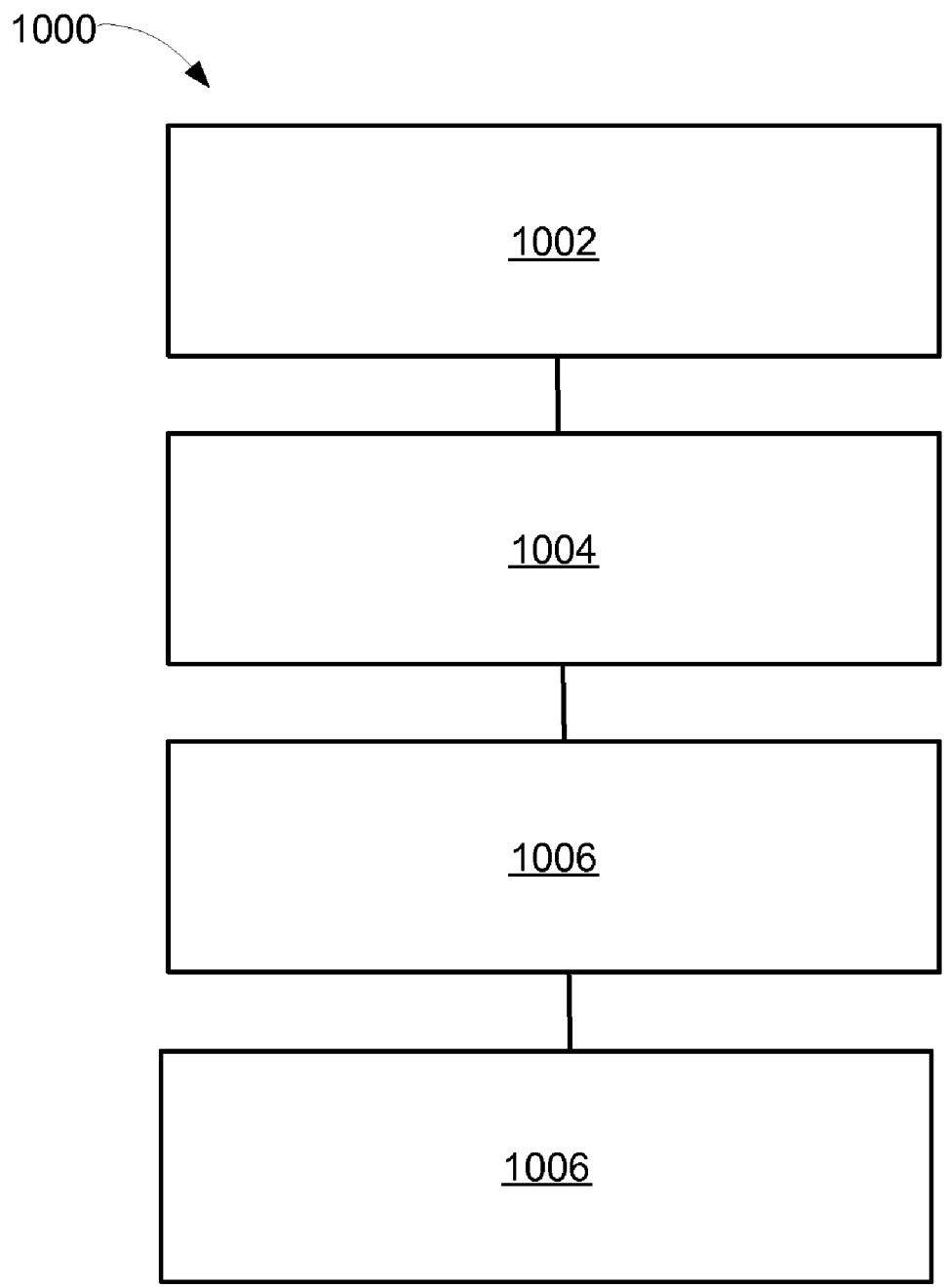
FIG. 10 is a flow chart of an integrated circuit packaging system for the manufacture of an integrated circuit packaging system with waferscale spacer in an embodiment of the present invention.

FIG. 10 is a flow chart of an integrated circuit package system 1000 for the manufacture of the integrated circuit package system 100 with waferscale spacer in an embodiment of the present invention. The system 1000 includes forming a first device wafer having a first backside and a first active side with a first contact pad thereon in a block 1002; forming a waferscale spacer wafer having a waferscale spacer and a first opening in a block 1004; mounting the waferscale spacer wafer on the first backside in a block 1006; and singulating an first integrated circuit die having the waferscale spacer from the first device wafer having the first backside with the waferscale spacer wafer thereon in a block 1008.

It has been discovered that the present invention thus has numerous aspects.

A principle aspect that has been unexpectedly discovered is that the present invention provides better vertical spacing control for stacked devices.

Another aspect is the process for the integrated circuit packaging system with waferscale spacer adds support to thinned wafers as well as during a thinning process and prevents manufacturing loss due to wafer warpage.

Yet another aspect is that the present invention provides spacer with height that may be readily adjusted to the various electrical interconnect needs, such as various clearance requirements of bond wires, ribbon bond wires, reverse stand-off stitch bond, or planar interconnects.

Yet another aspect is that the present invention provides stacking structures as part of a redistribution functions where the openings of the waferscale spacer wafer may direct reflow of conductive material on the bottom wafer. This may form complex and flexible wafer level chip scale packages (WLCSP) or complex integrated circuit stacks.

Yet another aspect is that the present invention provides stacking flexibility for integrated circuit devices of substantially the same size or different sizes.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with waferscale spacer of the present invention furnishes important and heretofore unknown and unavailable solutions, capabilities, and functional aspects for packages of same die stacks. The resulting processes and configurations are straightforward, cost-effective, uncomplicated, highly versatile and effective, can be surprisingly and unobviously implemented by adapting known technologies, and are thus readily suited for efficiently and economically manufacturing same die stacked integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit packaging system comprising:
    forming a first device wafer having a first backside and a first active side;
    forming a waferscale spacer wafer having a first opening;
    mounting the waferscale spacer wafer on the first backside; and
    singulating the first device wafer and the waferscale spacer wafer to form a first integrated circuit die and a waferscale spacer with the waferscale spacer having an exact fit at all four corners adjacent to the first integrated circuit die and a portion of the first opening along an edge of the integrated circuit die.

2. The method as claimed in claim 1 wherein:
    singulating the first integrated circuit die having the waferscale spacer includes:
        forming a recess of the waferscale spacer from the first opening; and further comprising:
    forming a second integrated circuit die having a contact pad; and
    mounting the first integrated circuit die having the waferscale spacer on the first backside over the second integrated circuit die with the recess aligned to expose the contact pad.

3. The method as claimed in claim 1 further comprising:
    forming a second device wafer having a second backside and a second active side with a contact pad thereon; and
    mounting the first device wafer, having the waferscale spacer on the first backside, with the first opening aligned over the second device wafer to expose the contact pad.

4. The method as claimed in claim 1 wherein:
    singulating the first integrated circuit die having the waferscale spacer includes:
        forming a recess of the waferscale spacer from the first opening; and further comprising:
    forming a substrate;
    mounting a second integrated circuit die having a contact pad over the substrate;
    mounting the first integrated circuit die having the waferscale spacer on the first backside over the second integrated circuit die with the recess aligned to expose the contact pad; and
    connecting an electrical interconnect between the contact pad in the recess and the substrate.

5. The method as claimed in claim 1 wherein forming the waferscale spacer wafer includes forming the waferscale spacer wafer with waferscale spacers of different forms.

6. A method of manufacturing an integrated circuit packaging system comprising:
    forming a first integrated circuit wafer having a first backside and a first active side;
    forming a waferscale spacer wafer having a first opening in a configuration to fit the first integrated circuit wafer;
    mounting the waferscale spacer wafer on the first backside and aligned to the first integrated circuit wafer; and
    singulating the first integrated circuit wafer and the waferscale spacer wafer to form a first integrated circuit die and a waferscale spacer with the waferscale spacer having an exact fit at all four corners adjacent to the first integrated circuit die and a portion of the first opening along a portion of the integrated circuit die.

7. The method as claimed in claim 6 further comprising:
    forming a second integrated circuit wafer having a second backside and a second active side with a contact pad thereon;
    mounting the first integrated circuit wafer, having the waferscale spacer on the first backside, with the first opening aligned to expose the contact pad; and
wherein:
    the singulating includes:
    singulating an integrated circuit stack with the first integrated circuit die from the first integrated circuit wafer having the waferscale spacer on the first backside and the first integrated circuit die is aligned over a second integrated circuit die from the second integrated circuit wafer.

8. The method as claimed in claim 6 wherein forming the waferscale spacer wafer includes forming an organic or inorganic material.

9. The method as claimed in claim 6 further comprising:
    forming a second integrated circuit wafer having a second backside and a second active side with a contact pad thereon;
    mounting the first integrated circuit wafer, having the waferscale spacer on the first backside, with the first opening aligned to expose the contact pad; and
    thinning the second backside with the first integrated circuit wafer having the waferscale spacer attached to the second integrated circuit wafer.

10. The method as claimed in claim 6 further comprising forming an electronic system having the integrated circuit package system.

* * * * *